(12) United States Patent
Cogdill et al.

(10) Patent No.: US 7,307,862 B2
(45) Date of Patent: Dec. 11, 2007

(54) CIRCUIT AND SYSTEM FOR ACCESSING MEMORY MODULES

(75) Inventors: Mike Cogdill, Longmont, CO (US); Idis Ramona Martinez, Roseville, CA (US); Derek Steven Schumacher, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 835 days.

(21) Appl. No.: 10/655,927

(22) Filed: Sep. 4, 2003

(65) Prior Publication Data

US 2005/0086418 A1   Apr. 21, 2005

(51) Int. Cl.
*G11C 5/06* (2006.01)

(52) U.S. Cl. .............................. 365/63; 365/51; 365/61

(58) Field of Classification Search ................. 365/63, 365/51, 61; 333/125, 126
See application file for complete search history.

(56) References Cited

U.S. PATENT DOCUMENTS

| 5,583,449 | A  | * | 12/1996 | Buuck et al. ................. 326/30 |
| 6,239,985 | B1 | * | 5/2001  | Feraud et al. ................ 361/788 |
| 6,356,106 | B1 | * | 3/2002  | Greeff et al. ................. 326/30 |
| 6,715,014 | B1 | * | 3/2004  | Johnson et al. ............. 710/105 |
| 7,054,179 | B2 | * | 5/2006  | Cogdill et al. ................. 365/63 |

* cited by examiner

*Primary Examiner*—Anh Phung
*Assistant Examiner*—Toan Le

(57) ABSTRACT

A circuit and system for improving signal integrity in a memory system. The circuit has a transmission line having a dampening impedance between a driver and a branch point of the transmission line. The circuit also has a termination impedance having one end coupled to the transmission line between the dampening impedance and the branch point. The transmission line has branches coupled to memory module interfaces. The branches have respective lengths between the branch point and the memory module interfaces to be configured symmetrically, wherein the branch point is at a point to balance signal transmission on the branches.

25 Claims, 5 Drawing Sheets

CIRCUIT AND SYSTEM FOR ACCESSING MEMORY MODULES

TECHNICAL FIELD

The present invention relates to the field of computer systems. Specifically, embodiments of the present invention relate to a circuit and system for improving signal integrity when transferring data to or from computer memory.

BACKGROUND ART

Conventionally, a circuit 100 such as shown in FIG. 1 is used for data transmission to memory modules 110. The circuit 100 comprises a transmission path 115 from a driver 120 to the several memory modules 110. The memory modules 110 may be, for example, dual inline memory modules (DIMMs). The memory itself may be, for example, double data rate (DDR) synchronous dynamic random access memory (SDRAM). The transmission line 115 has a series resistance 125 between the driver 120 and the memory modules 10 to dampen reflections coming back from the memory modules 110. The reflections are due to impedance mismatches between the transmission line 115 and the memory modules 110 and detrimentally interfere with signal transmission. The circuit 100 has a parallel resistance 130 that is on the opposite side of the memory modules 110 as the series resistance 125. The parallel resistance 130 matches the impedance of the transmission line 115 such that there will be no reflections back from the end of the transmission line 115. Thus, the parallel resistor 130 serves to terminate the signal at the end of the transmission line 115. The parallel resistance 130 is coupled to a termination voltage 140.

The circuit of FIG. 1 is adequate for many types of memory modules. However, the need for ever more memory has led to memory modules for which the conventional circuit of FIG. 1 is inadequate. For example, in order to get more memory on a memory module, some memory modules are "double high". For example, a second DRAM may be incorporated onto each memory module. Unfortunately, "double high" configurations can cause increased signal reflection if the conventional circuit of FIG. 1 is used. For example, a portion of the signal transmitted to the memory modules reflects back towards the buffer. Such signal reflections degrade the signal considerably.

FIG. 2 is a graph 200 of voltage versus time illustrating an exemplary signal 210 transmitted on the transmission line 115 of the circuit 100 of FIG. 1. The exemplary signal 210 exhibits considerable degradation due to reflections. The exemplary signal 210 ideally would appear as a square wave (not depicted) and should fall continuously to its minimum and then rise continuously. However, reflections on the transmission line cause the exemplary signal 210 to have a non-monotonic region 215a on the generally falling edge. The non-monotonic region 215a on the falling edge has a portion that increases in magnitude slightly. Further, the reflections can also cause non-monotonic region 215b on the generally rising edge that has a portion that decreases in magnitude slightly. These non-monotonic regions 215a, 215b can interfere with proper registering of the data, especially in a source synchronous system. For example, a source synchronous system typically comprises a strobe trace for each eight data traces. A signal is sent on the strobe trace at the same time as signals are sent on the data traces in order to instruct the memory modules to clock in the data on, for example, the rising edge of the strobe signal. However, if the signal on the strobe trace is distorted, such as depicted in FIG. 2, the timing for clocking in the data can be thrown off such that the data is not properly registered. For example, a false rising edge may be detected, and consequently the data may be registered at the wrong point in time.

Thus, one problem with some conventional circuits for delivering a signal to or from a memory module is that memory units added to the memory module cause problematic signal reflection that degrade signal quality. Another problem with some conventional circuits for delivering a signal to or from a memory module is that data maybe improperly registered if the circuit is used to access a memory configuration with added memory modules.

DISCLOSURE OF THE INVENTION

The present invention pertains to a circuit and system for improving signal integrity in a memory system. In one embodiment, the circuit comprises a transmission line having a dampening impedance between a driver and a branch point of the transmission line. The circuit also has a termination impedance having one end coupled to the transmission line between the dampening impedance and the branch point. The transmission line has branches coupled to memory module interfaces. The branches have respective lengths between the branch point and the memory module interfaces to be configured symmetrically, wherein the branch point is at a point to balance signal transmission on the branches.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of embodiments of the present invention, a circuit and system for accessing memory modules, numerous specific details are set forth in order to provide a thorough understanding of the present invention. However, embodiments of the present invention may be practiced without these specific details or by using alternative elements or methods. In other instances well known methods, procedures, components, and circuits have not been described in detail as not to unnecessarily obscure aspects of the present invention.

Embodiments of the present invention provide a circuit and a system that maintain high signal quality when transferring a signal to or from a memory module for which signal reflections are problematic if a conventional circuit or system were used to transfer the signal. For example, embodiments of the present invention are well suited to data transfer when accessing double high memory modules. In one embodiment in accordance with the invention, the memory modules are dual inline memory modules (DIMMs). The memory itself is double data rate (DDR) synchronous dynamic random access memory (SDRAM), in accordance with an embodiment of the present invention.

Figure 3:
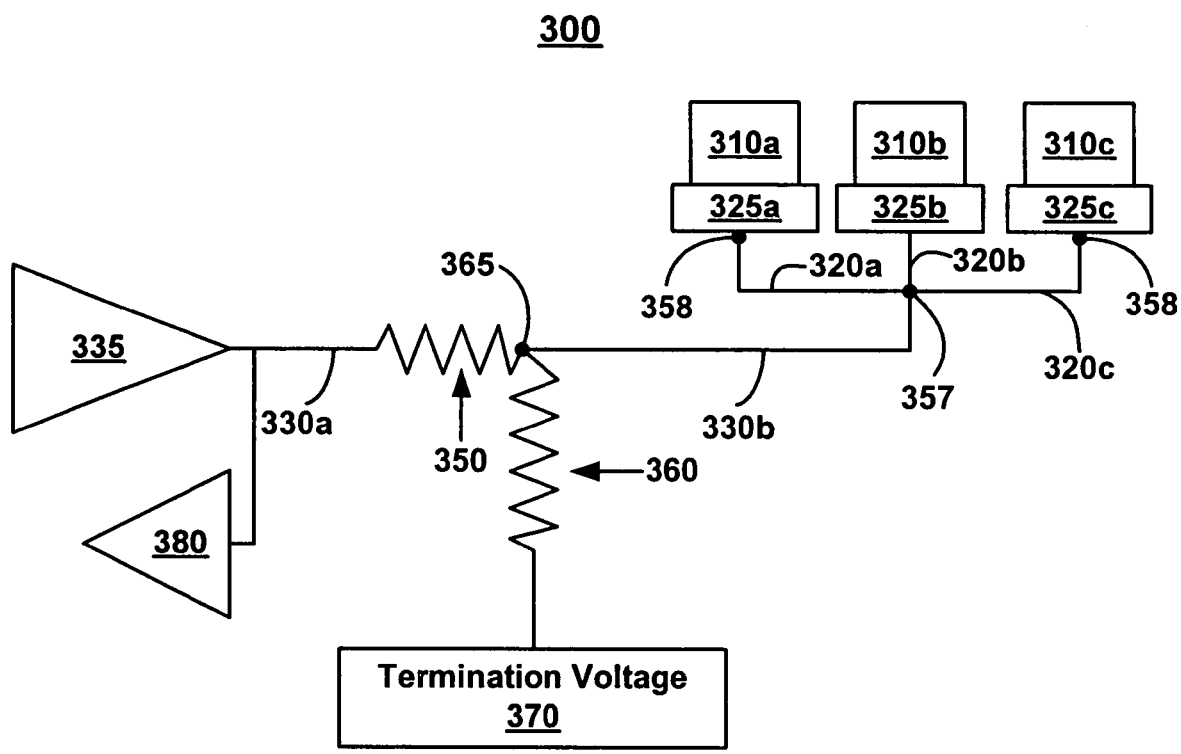
FIG. 3 is a circuit for accessing memory modules, according to an embodiment of the present invention.

FIG. 3 is a circuit 300 for accessing memory modules 310, according to an embodiment of the present invention. The circuit 300 reduces reflections that would otherwise occur if a conventional design such as the one depicted in FIG. 1 were used. Reducing reflections improves the signal quality. Moreover data is properly registered with the improved signal quality. The circuit 300 has a data line having branches 320a-c that are coupled to interfaces 325a-c that are able to receive memory modules 310a-c. The branches of the data line 320a-c are coupled to the interfaces 325a-c to allow data transfer to/from the memory modules 310a-c. The circuit 300 also has a transmission line 330 having a first end coupled to a driver 335 and a second end coupled to the data line 320. The transmission line includes a first segment between 330a between the driver 335 and the series impedance 350, the series impedance 350, and a second segment 330b between the series impedance 350 and the branch point 357. The distinction between the transmission line 330 and the data line 320 is made for purposes of clarity of discussion. The transmission line 330 and the data line 320 could also be described-different portions of the same signal line. For example, the data line 320 may be described as branches in the transmission line 330 that stem from branch point 357. The transmission line 330 is bi-directional and also couples to a receiver 380.

Still referring to FIG. 3, the transmission line 330 comprises a series dampening impedance 350. The circuit 300 also has a parallel termination impedance 360 having one end coupled to a node 365 on the transmission line 330 between the dampening impedance 350 and the data line 320. The termination impedance 360 is connected to the dampening impedance 350, in one embodiment of the present invention. However, it is not required that the dampening impedance 350 and the termination impedance 360 be connected without any intervening element. The other end of the termination impedance 360 is coupled to a termination voltage 370.

Figure 1:
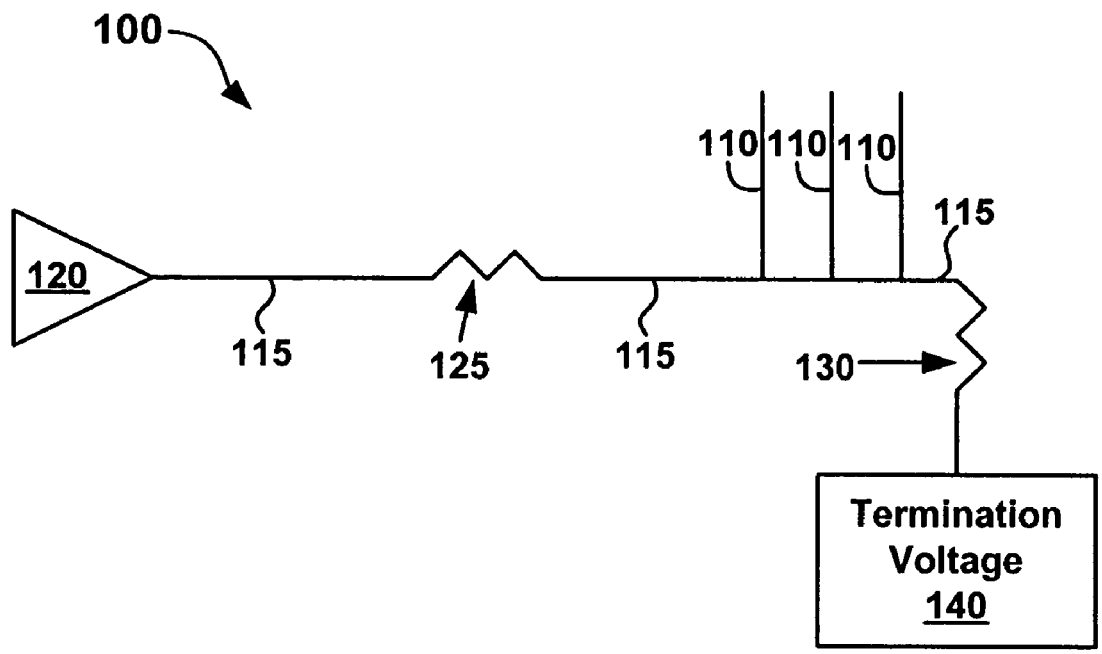
FIG. 1 illustrates a conventional comb configuration of a data bus for accessing memory modules.

Referring briefly to FIG. 1, the purpose of the pull-up parallel termination resistor 130 is to terminate the signal at the end of the transmission line 115. As such, it is not considered intuitive to place a parallel termination impedance on the same side of the memory modules as the driver. Referring now to FIG. 3, the termination impedance 360 is placed on the same side of the memory modules 310 as the driver 335. As positioned, the combination of the series dampening impedance 350 and the parallel termination impedance 360 prevents, or at least reduces, reflections from the memory modules 310 from travelling back to the driver 335 in the region of the transmission line 330 between the parallel termination resistor 360 and the driver 335. There may be some reflections in the region of the transmission line 330 between the parallel termination resistor 360 and the data line 320, as well as on the data line 320.

However, embodiments of the present invention are configured such that reflections between the parallel termination resistor 360 and the memory modules 310 do not cause significant signal integrity problems. For example, the memory modules 310 are located very close to each other relative to the size of the wavelength of a typical signal. Moreover, the distance between the branch point 357 and the parallel termination resistor 360 is small, in embodiments of the present invention.

The transmission line 330 connects to a branch point 357 on the data line to achieve a symmetrical configuration in the various branches of the data line 320. For example, the transmission line 330 is connected to the data line 320 at a branch point 357 to balance signal transmission between the branch point 357 and the ends 358 of the data line 320. In FIG. 3, the branch point 357 is nearest to the middle of the three memory modules 310b. The distance between the branch point 357 and the middle memory module 310b does not have to be the same at the distance between the branch point 357 and the respective outer memory modules 310a, 310c.

In embodiments of the present invention, the configuration of the series dampening impedance 350 and the parallel termination impedance 360 provides flexibility in controlling the magnitude of the signal on the transmission line 320 not available in the conventional circuit of FIG. 1. The series dampening impedance 350 and the parallel termination impedance 360 form a voltage divider. By selecting appropriate impedance values for the series dampening impedance 350 and the parallel termination impedance 360, the magnitude of the signal on the transmission line 320 is controlled, according to an embodiment of the present invention.

For clarity, FIG. 3 only depicts a single set of components. Embodiments of the present invention have numerous sets of components each for transferring data and or a strobe signal to clock in the data to separate pins of respective memory module interfaces.

There may be more or fewer memory module connectors 325 than shown in FIG. 3. Moreover, it is not required that all of the memory module connectors 325 contain memory modules 330. Further, it is not required that there be any symmetry in which of the memory module connectors 325 contain memory modules 330. In one embodiment in accordance with the present invention, the balancing or symmetry of the data line 320 is achieved by having substantially the same distance between the branch point 357 to each end 358 of the data line 358. For example branches 320a and 320c are substantially the same length. It is not required that branch 320b be the same length as the other two branches 320a and 320c. The amount of difference in length of branches 320a and 320c that is tolerable will depend on factors such as the wavelength of the signal transmission. As such, there is not a specified difference in length because the invention is not limited to transmitting signals of any particular wavelength. However, it may be stated that substantially the same distance means that the difference in the length of the branches 320a and 320c is such that signal integrity meets a desired system requirement. For example, in one embodiment in accordance with the invention, the branches 320a and 320c have a difference in length that is equal to or less than one-half of the wavelength of a signal for which the circuit 300 is intended. This allows the circuit 300 to provide a high integrity signal and meet desired specifications.

Because of the symmetry of branches 320a-c, the waveform at the two outer memory modules 310a, 310c will be essentially identical. The waveform at the central memory module 310b will be slightly different from that of the waveform at the outer memory modules 310*a* and 310*c*, but because the relative distances between the memory modules 310 is small as compared to the wavelength of a typical signal, there is not a significant reflection problem. Moreover, the length of branch 320*b* does not have to be equal to the length of branches 320*a* and 320*c* for there to be symmetry along the data line 320.

Figure 2:
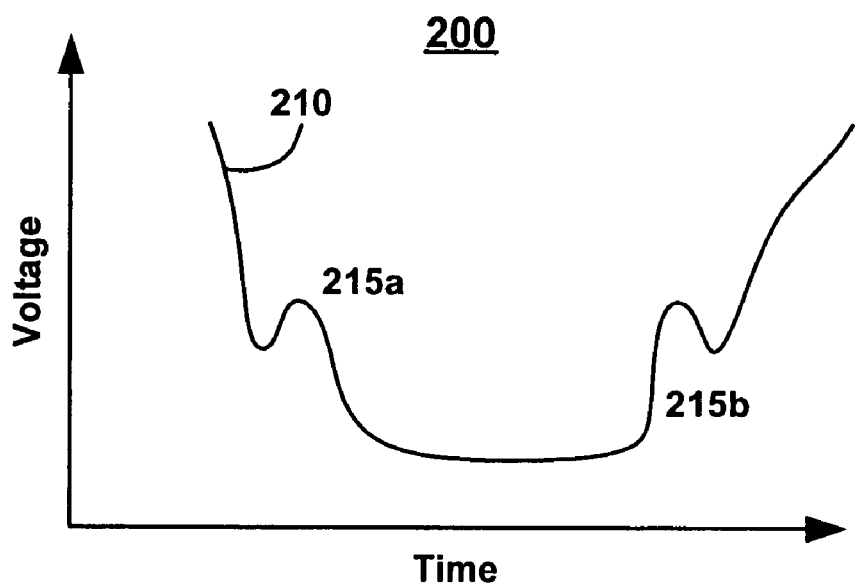
FIG. 2 is a graph illustrating loss of signal integrity that occurs if the conventional system of FIG. 1 is used to access double high memory.
Figure 4:
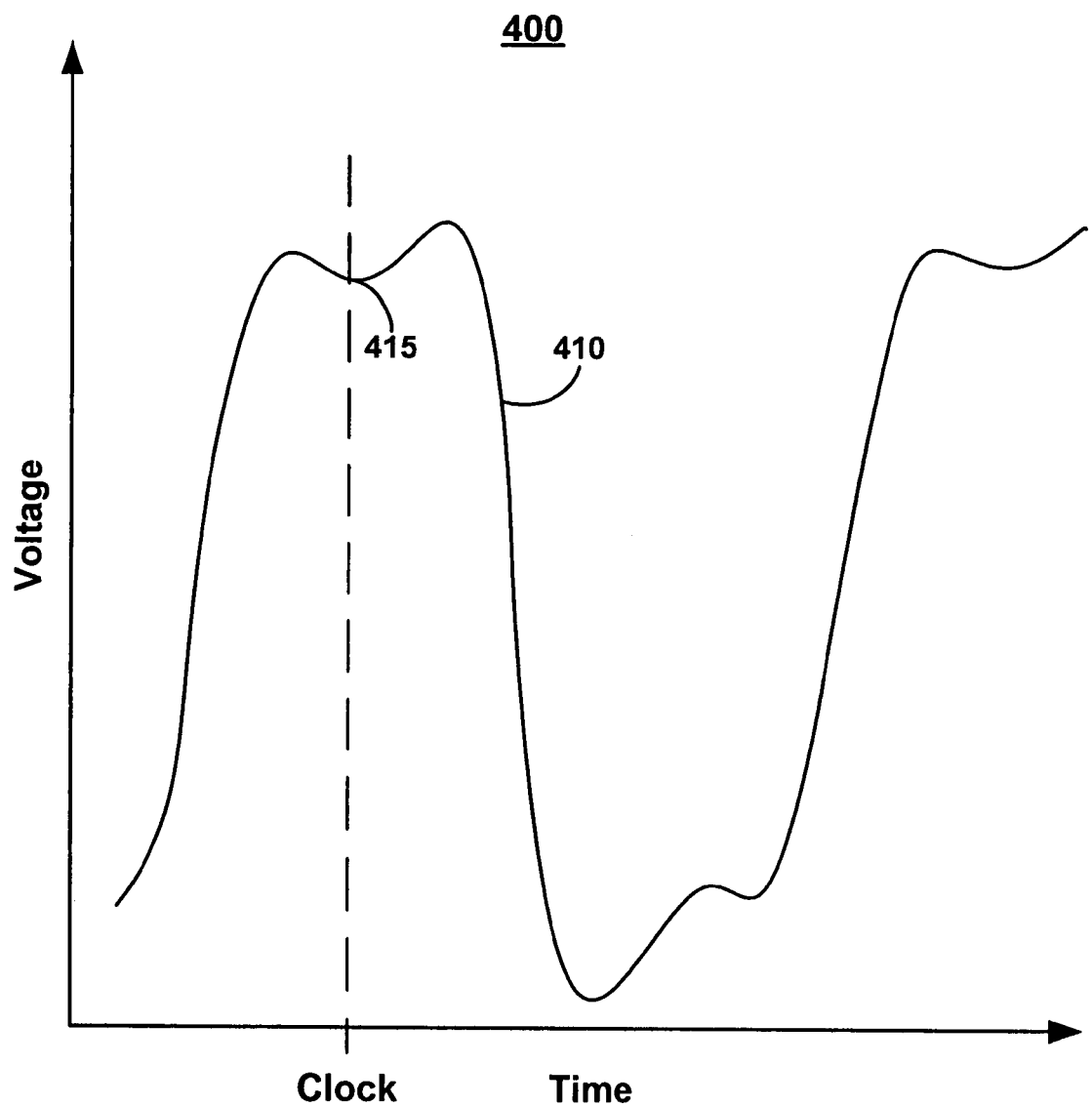
FIG. 4 is a graph illustrating signal integrity when accessing double high memory using a circuit in accordance to an embodiment of the present invention.

FIG. 4 is a graph 400 illustrating an exemplary waveform 410 achievable using the circuit of FIG. 3. In contrast, to the conventional waveform of FIG. 2, which exhibits problem points 215*a*-215*b* on the falling and rising edges, the exemplary waveform 410 does not exhibit problem points on the falling and rising edge. Therefore, the exemplary waveform does not clock in data at the wrong time, as can happen if a conventional circuit such as the one of FIG. 1 is used for memory such as double high memory modules.

The exemplary waveform 410 may exhibit some deviations at the top and bottom edges. However, these deviations are not of sufficient magnitude to cause data to be incorrectly registered. For example, if the exemplary waveform 410 is a data signal that is clocked in at the point on the time axis indicated by "clock", the dip 415 in the exemplary waveform 410 is not of sufficient magnitude to cause the data signal to be interpreted as low magnitude rather than high magnitude.

Figure 5:
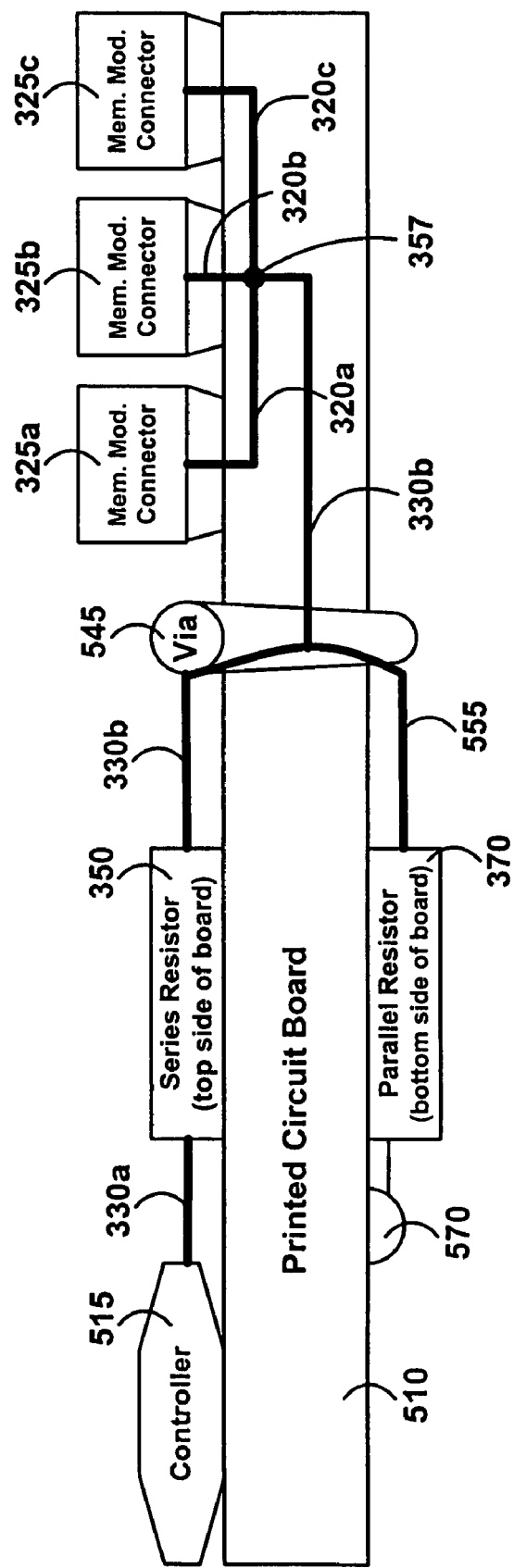
FIG. 5 is a side view of a system for accessing memory modules, according to an embodiment of the present invention.

FIG. 5 is a side view of a system 500 for accessing memory modules, according to an embodiment of the present invention. FIG. 5 illustrates one possible placement for the dampening and termination impedances. The system 500 includes a printed circuit board (PC board) 510 upon which the dampening and termination impedances 350, 360 are mounted. Also mounted on the PC board 510 are a controller 515 and memory module connectors 325.

The dampening and termination impedances 350, 360 are electrically coupled by a line through the via 545 in the PC board 10. Placing the dampening and termination impedances 350, 360 on opposite sides of the PC board 510 may allow for a more compact PC board than if both impedances 350, 360 are placed on the same side of the PC board 510, although it is not required that the impedances be located on opposite sides of the PC board 510.

The system 500 includes a transmission line that couples the controller 515 with the memory module connectors 325. A portion of the transmission line 330*a* is coupled between the controller 515 and the dampening impedance 350. The dampening impedance 350 may also be referred to as a series impedance. Another portion of the transmission line 330*b* is coupled between the dampening impedance 350 and the memory module connectors 325. The second portion the transmission line 300*b* extends partway through the via 545, extending from the top of the PC board 510 to a point on the interior of the PC board 510. A first end of the termination impedance 360 is electrically coupled to the transmission line 330 by termination impedance line 555. A second end of the termination impedance 360 is electrically connected to a termination voltage terminal 570.

The second portion of the transmission line 330*b* couples to a branched portion of the transmission line 320, which branches into three separate parts 320*a*, 320*b*, 320*c*. Each part of the third or branched portion of the transmission line 320 couples to a memory module connector 325*a*-*c*. The memory modules are not depicted in FIG. 5. In one embodiment in accordance with the invention, the memory modules are dual inline memory modules (DIMMs). The memory itself is double data rate (DDR) synchronous dynamic random access memory (SDRAM), in accordance with an embodiment of the present invention.

Figure 6:
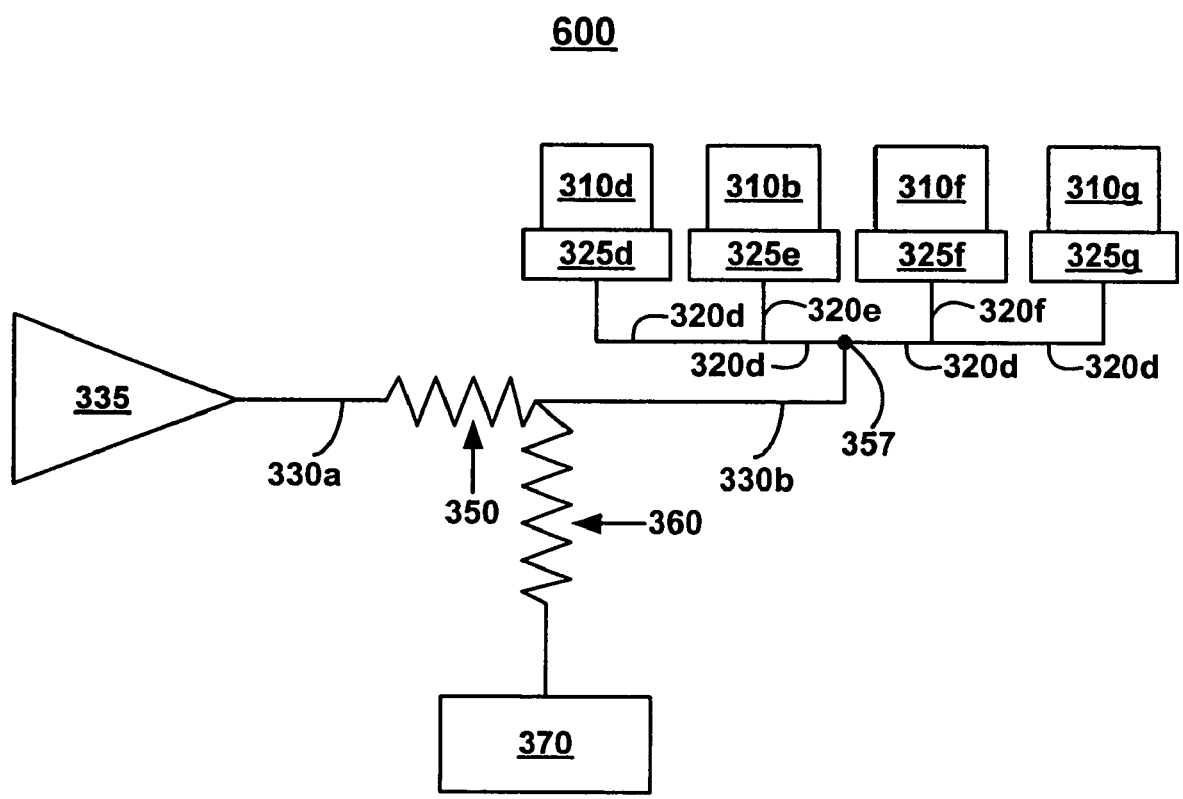
FIG. 6 is circuit for accessing memory modules, according to an embodiment of the present invention.

While embodiments of the present invention have three memory modules, there can be more or fewer memory modules. There may be an even number of memory modules. FIG. 6 illustrates an embodiment in accordance with the present invention in which there are four memory module interfaces and four memory modules. The circuit 600 of FIG. 6 includes a transmission line 330 that electrically couples the driver 335 to the memory module connectors 325*d*-*g*. A first portion of the transmission line 330*a* couples the driver 335 to a first side of a series dampening impedance 350. A parallel dampening impedance is coupled from the second side of the series dampening impedance 350 to a termination voltage 370. A second portion of the transmission line 330*b* couples the second side of the series dampening impedance 350 to a node 357 on a third portion of the transmission line 320. The third portion of the transmission line 320 has branches 320*d*-320*g* that couples to respective ones of the memory module connectors 325*d*-*g*. It will be understood that the numbering convention used for the branches 320*d*-*g* is for purposes of illustration. For example, the portion between the branch point 357 and the branch 320*e* to memory module interface 325*e* that is labeled as branch 320*d* could be labeled as part of the branch 320*e* instead.

In the embodiment of FIG. 6, the branch point 357 is between the two memory module connectors 325*e*, 325*f* nearest the mid-point of the third portion of the transmission line 320. The branch point 357 is substantially midway between the ends of the third portion of the transmission line 320, in this embodiment. This provides a symmetrical topology in which signal transmission on the transmission line is balanced. For example, the distance from branch point 357 to each of the outmost memory module connectors 325*d*, 325*g* is substantially the same. Moreover, there is a symmetry between the branch point 357 and the two innermost memory module connectors 325*e*, 325*f*. In one embodiment of the present invention, the deviation in the distance from branch point 357 to one of the outmost memory module connectors 325*d* and the distance from branch point 357 to the other of the outmost memory module connectors 325*g* is one half wavelength or less, with respect to a wavelength of a signal that is to be transmitted over the transmission line 330.

For clarity of illustration, only one transmission line has been shown in FIG. 6. However, it will be understood that typically there are many transmission lines coupled to each memory module connector 325. In one embodiment, one transmission line is used to transmit a strobe signal that clocks in data signals that are concurrently transmitted on other similar transmission lines.

While the present invention has been described in particular embodiments, it should be appreciated that the present invention should not be construed as limited by such embodiments, but rather construed according to the below claims.

We claim:

1. A circuit for improving signal integrity in a memory system comprising:

a transmission line comprising a dampening impedance between a driver and a branch point of said transmission line; and a termination impedance having one end coupled to said transmission line between said dampening impedance and said branch point;

said transmission line having branches from said branch point and coupled to memory module interfaces, said branches having respective lengths between said branch point and said memory module interfaces to be configured symmetrically, wherein said branch point is at a point to balance signal transmission on said branches.

2. The circuit of claim 1, wherein said transmission line is bi-directional.

3. The circuit of claim 1, wherein two of said branches have substantially the same length.

4. The circuit of claim 3, wherein a third of said branches does not have substantially the same length as said two of said branches.

5. The circuit of claim 1, wherein said circuit provides signal integrity for memory modules having a double high configuration.

6. The circuit of claim 1, wherein said branches couple to an odd number of memory module interfaces and wherein at least one pair of branches have substantially the same length.

7. The circuit of claim 1, wherein said branches couple to an even number of memory module interfaces and wherein pairs of branches have substantially the same length.

8. The circuit of claim 1, wherein said termination impedance is connected to said dampening impedance.

9. The circuit of claim 1, further comprising a receiver coupled to said transmission line, wherein said dampening impedance is between said receiver and said branch point.

10. A circuit for improving signal integrity in a memory system comprising:
a plurality of memory modules;
a data line having a first end and a second end, said data line coupling said memory modules; and
a transmission line having a series resistance and a parallel resistance in a stub configuration;
said transmission line having a first end coupled to a driver and a second end connected at a point on said data line to balance signal transmission between said point on said data line and said first and second ends of said data line.

11. The circuit of claim 10, wherein said transmission line is bi-directional.

12. The circuit of claim 10, wherein said transmission line is connected at substantially the midpoint of said data line.

13. The circuit of claim 10, wherein said termination impedance is connected to said dampening impedance.

14. The circuit of claim 10, further comprising a receiver coupled to said first end of said transmission line.

15. The circuit of claim 10, wherein said plurality of memory have a double high configuration.

16. The circuit of claim 10, wherein said plurality of memory modules is an odd number and wherein said second end of said transmission line is connected to said data line at the middle memory module.

17. The circuit of claim 10, wherein said plurality of memory modules is an even number and wherein said second end of said transmission line is connected to said data line at a point substantially midway between two memory modules closest to the mid-point of said data line.

18. A system comprising:
a bus controller;
a transmission line comprising a series impedance between a driver and a branch point of said transmission line; and
a parallel impedance having a first end coupled to said transmission line between said dampening impedance and said branch point and a second end coupled to a termination voltage terminal;
said transmission line having branches coupled to memory module interfaces, said branches having respective lengths between said branch point and said memory module interfaces to be configured symmetrically, wherein said branch point is at a point to balance signal transmission on said branches.

19. The system of claim 18, wherein said transmission line is bi-directional.

20. The system of claim 18, wherein two of said branches have substantially the same length.

21. The system of claim 20, wherein a third of said branches does not have substantially the same length as said two of said branches.

22. The system of claim 18, wherein said circuit provides signal integrity for memory modules having a double high configuration.

23. The system of claim 18, wherein said branches couple to an odd number of memory modules and wherein at least one pair of branches have substantially the same length.

24. The system of claim 18, wherein said branches couple to an even number of memory modules and wherein pairs of branches have substantially the same length.

25. The system of claim 18, further comprising a receiver coupled to said transmission line, wherein said dampening impedance is between said receiver and said branch point.

* * * * *

UNITED STATES PATENT AND TRADEMARK OFFICE
CERTIFICATE OF CORRECTION

PATENT NO. : 7,307,862 B2  Page 1 of 1
APPLICATION NO. : 10/655927
DATED : December 11, 2007
INVENTOR(S) : Mike Cogdill et al.

It is certified that error appears in the above-identified patent and that said Letters Patent is hereby corrected as shown below:

In column 1, line 22, delete "10" and insert -- 110 --, therefor.

In column 5, line 36, delete "10" and insert -- 510 --, therefor.

Signed and Sealed this

Third Day of June, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,307,862 B2 | Page 1 of 1 |
| APPLICATION NO. | : 10/655927 | |
| DATED | : December 11, 2007 | |
| INVENTOR(S) | : Mike Cogdill et al. | |

It is certified that error appears in the above-identified patent and that said Letters Patent is hereby corrected as shown below:

In column 1, line 22, delete "10" and insert -- 110 --, therefor.

In column 5, line 36, delete "10" and insert -- 510 --, therefor.

Signed and Sealed this

Twenty-fourth Day of June, 2008

JON W. DUDAS
*Director of the United States Patent and Trademark Office*